(12) United States Patent
Xu et al.

(10) Patent No.: US 9,515,062 B2
(45) Date of Patent: Dec. 6, 2016

(54) ELECTRONIC DEVICES AND METHODS HAVING A COMPACT MULTI-WAY TRANSFORMER COMBINER

(71) Applicant: Intel Corporation, Santa Clara, CA (US)

(72) Inventors: Hongtao Xu, Portland, OR (US); Georgios Palaskas, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/575,908

(22) Filed: Dec. 18, 2014

(65) Prior Publication Data

US 2016/0181234 A1    Jun. 23, 2016

(51) Int. Cl.
| | |
|---|---|
| H03F 3/68 | (2006.01) |
| H01L 27/02 | (2006.01) |
| H01L 21/768 | (2006.01) |
| H03F 3/193 | (2006.01) |
| H03F 3/21 | (2006.01) |
| H03F 3/213 | (2006.01) |
| H03F 3/45 | (2006.01) |

(52) U.S. Cl.
CPC ..... *H01L 27/0207* (2013.01); *H01L 21/76895* (2013.01); *H03F 3/193* (2013.01); *H03F 3/211* (2013.01); *H03F 3/213* (2013.01); *H03F 3/45179* (2013.01); *H03F 2200/294* (2013.01); *H03F 2200/451* (2013.01); *H03F 2203/21142* (2013.01)

(58) Field of Classification Search
CPC ............ H03F 1/18; H03F 3/60; H03F 3/605; H03F 3/68; H03F 2203/21106; H03F 2203/21109; H03F 2201/3206; H03F 2201/3221; H03F 2203/21142; H03F 2203/21145; H03F 2203/45138

USPC ............ 330/53, 54, 65, 107, 109, 120, 122, 330/124 R, 154, 157, 185, 192, 286, 295, 330/304, 307; 331/32, 34, 76, 96; 333/1, 5, 333/17.1, 24, 27, 202, 219, 235
See application file for complete search history.

(56) References Cited

U.S. PATENT DOCUMENTS

| | | |
|---|---|---|
| 2006/0250187 A1 | 11/2006 | Aoki et al. |
| 2010/0164628 A1 | 7/2010 | Pallotta |

(Continued)

FOREIGN PATENT DOCUMENTS

| | | |
|---|---|---|
| TW | 200950320 A | 12/2009 |
| TW | 201342818 A | 10/2013 |

(Continued)

OTHER PUBLICATIONS

Nivedita Shetter, "Circuit Design Proces:Unit II",slides 57-58, Published on Oct. 3, 2013.*

(Continued)

*Primary Examiner* — Steven J Mottola
*Assistant Examiner* — Hafizur Rahman
(74) *Attorney, Agent, or Firm* — Schwegman Lundberg & Woessner, P.A.

(57) ABSTRACT

Apparatus having structures implementing compact and symmetric multi-way transformer combiners are described herein. In an embodiment, each unit device cell of a plurality unit device cells may include two metal layers on top of the unit device cell coupled to a multi-way transformer combiner by one of the two metal layers such that the configuration of the unit device cells with the multi-way transformer combiner is symmetric. Additional apparatus, systems, and methods are disclosed.

24 Claims, 8 Drawing Sheets

(56) References Cited

U.S. PATENT DOCUMENTS

| | | |
|---|---|---|
| 2010/0225397 A1 | 9/2010 | Onizuka et al. |
| 2013/0099864 A1* | 4/2013 | Kawai ................. H01P 5/10 330/273 |
| 2014/0087672 A1* | 3/2014 | Mostov ............... H03F 1/0227 455/78 |

FOREIGN PATENT DOCUMENTS

| | | |
|---|---|---|
| WO | WO-2004036751 A2 | 4/2004 |
| WO | WO-2005098880 A2 | 10/2005 |

OTHER PUBLICATIONS

Tsai et al. "Layout Practice Layout Practice for Die Size Reduction on InGaP/GaAs HBT MMICs for Handset Power Amplifier Applications", Win Semiconductor Corporation, CS MANTECH Conference, May 13-16, 2013, New Orleans, Louisiana, USA.*

"European Application Serial No. 15194798.3, Extended European Search Report mailed Apr. 25, 2016", 9 pgs.

Taiwanese Application Serial No. 104137579, Office Action mailed Aug. 23, 2016, W/ English Translation, 22 pgs.

* cited by examiner

ELECTRONIC DEVICES AND METHODS HAVING A COMPACT MULTI-WAY TRANSFORMER COMBINER

TECHNICAL FIELD

Examples pertain to compact electronic structures. Some examples relate to transformer combiners. Some examples relate to power amplifiers and power amplification. Some examples relate to power amplifiers for use in transmitters, including transmitters suitable for a mobile communication standard, such as 3GPP LTE, devices and transmitters suitable for other connectivity standards, such as WLAN and Wi-Fi devices.

BACKGROUND

A transformer combiner is an efficient way to build a high power radio frequency (RF) power amplifier. In order to increase output power level, a multi-way, such as a 2-way, a 4-way, an 8-way, or higher, are commonly used to stack RF voltage on a secondary inductor. A multi-way transformer combiner may be realized by a configuration of multiple sections of primary inductors and a single secondary of a continual inductor with only two output terminals. This configuration provides for the combination of the voltage from the multiple primary inductors to combine the power from these multiple sections together to deliver to the secondary.

In advance fabrication technologies, building a multi-way transformer combiner has several limitations on size and symmetrical layout arrangement. One design to provide a solution to these limits is an active distributed transformer using a transmission line inductor. This configuration uses a transmission line inductor based transformer with power amplifier (PA) devices placed at corners to maintain a symmetric structural layout. However, this requires gate orthogonal orientations in each differential PA pair, while some advanced complementary metal oxide field effect transistor (CMOS) fabrication technologies allow single gate orientation only.

Another approach uses a multi-section transformer having a figure eight type transformer combiner structural layout. This configuration helps to maintain single gate orientation, but it requires larger die area. In addition, first and last PAs in a PA row see slightly different surrounding metal structure. Another option uses a running track type transformer combiner, which includes a transmission line transformer layout with PA devices placed along with horizontal traces. This configuration also generates a non-symmetric layout between horizontal and vertical inductors.

BRIEF DESCRIPTION OF THE DRAWINGS

Examples are illustrated by way of example and not limitation in the figures of the accompanying drawings in which.

DETAILED DESCRIPTION

The following detailed description refers to the accompanying drawings that show, by way of illustration, details and embodiments in which embodiments may be practiced. These embodiments are described in sufficient detail to enable those skilled in the art to practice them. Other embodiments may be utilized and structural, logical, and electrical changes may be made without departing from the inventive subject matter. The various embodiments disclosed herein are not necessarily mutually exclusive, as some embodiments can be combined with one or more other embodiments to form new embodiments. The following detailed description is, therefore, not to be taken in a limiting sense.

A compact transformer layout topology may be implemented to couple circuits to the compact transformer by coupling each circuit to the transformer in the same manner, where each circuit has a structural layout within the circuit that is the same as (or common to) the other circuits. The common structural layout can include structural layouts that differ by flipping the layout with respect to the x/y axis. Each circuit can include two metal layers on top of the circuit, where the circuit may be coupled to the transformer by one of the two metal layers such that arrangement of the circuits with the transformer is symmetric. The other of the two metal layers can be configured to couple a signal from the circuit to the metal layer coupled to the transformer. The two metal layers can be configured with a 45 degree offset to each other before feeding to transformer, which may allow for a symmetrical transformer layout and for identical connection at each transformer terminal. The two metal layers may each be configured as straight metal lines at an approximate 45 degree offset. Alternatively, horizontal and vertical sections can be implemented to provide an approximate 45 degree offset. Such configurations allow use of fabrication technologies that have single device gate orientation and symmetrical/identical inductor in each section.

Each circuit may be configured as a unit device cell that can be replicated in a straight forward manner and the transformer may be configured as a multi-way transformer combiner having a symmetric layout on a substrate. The unit device cell may include an active device, where with the two metal layers on top of the unit cell, the two metal layers are on top of the active device. An active device is typically a component in a device or circuit that has the capability in operation to electrically control electron flow. For example, a transistor such as a metal oxide semiconductor (MOS)

transistor is an active device, where regulation of an electrical voltage applied to the gate of the transistor can control the electron flow. Transistors can be used in device cells as access transistors or other functional components. As noted above, the unit device cell may be coupled to the multi-way transformer combiner by one of the two metal layers such that configuration of the unit device cells with the multi-way transformer combiner is symmetric. The use of the two metal lines at the 45 degree offset allows for an number of different types of circuits or unit device cells to be coupled with a multi-way transformer combiner to provide a symmetric configuration. This configuration may also provide an integrated electronic device. Unit device cells may include a unit PA cell, a unit inductor/transformer based voltage-controlled oscillator (VCO) cell, a unit low noise amplifier cell, or other device cell.

For ease of presentation, the following discussions describe topologies to build a unit device cell using two metal layers with 45 degree offset to each other before feeding to a transformer in terms of a unit PA cell. This configuration allows a symmetrical transformer combiner layout and an identical connection at each transformer terminal to be maintained. Various of these topologies may be used in structural configurations of power amplifiers for use in transmitters, including transmitters suitable for 3GPP (3rd Generation Partnership Project) LTE (Long-Term Evolution) devices and transmitters suitable for WLAN (wireless local area network) and Wi-Fi devices.

Symmetrical transformer layout is important to maintain excellent differential operation. Symmetrical transformer layout may help to reduce harmonic content and may achieve better rejection on common mode signals. Having identical transformer branches can also enable advanced efficiency enhancement techniques, such as dynamic turning transformer section on-off. For example, a substantially perfectly symmetrical transformer layout may provide a −6 dB power reduction with half number of PAs turned off.

With this topology, the structural layout of each unit PA can be reused without rotation. Note, however, that x/y axis flipping can be conducted. In such a configuration, the feeding network for each unit PA output connected to transformer terminal may be identical. Therefore, all gate orientation may be identical. This topology may provide transformer routing that is symmetrical in all directions, where each connected PA may then experience identical loading with all parasitics considered. An approach to providing a symmetrical transformer combiner layout with a plurality of unit cells may be realized by forming unit cells of circuits or devices using two upper metal layers, such as top metals or redistribution layer (RDL) in semiconductor processing. Such semiconductor processing may be provided in almost all advanced CMOS technologies.

Figure 1A:
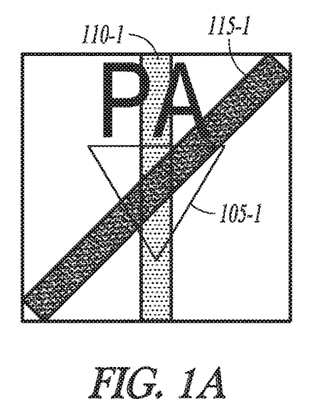
FIGS. 1A-1B show examples of top metal structures of unit power amplifiers for symmetrical transformer combiners in accordance with some examples.
Figure 1B:
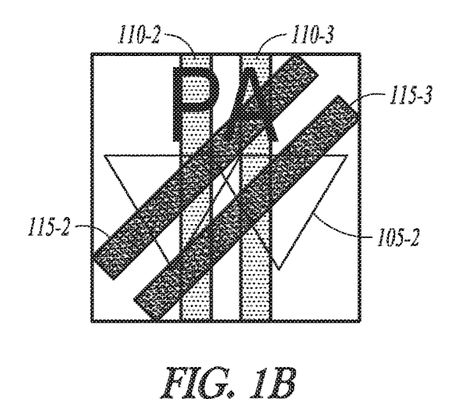

FIG. 1A shows an example structure of two top metal layers for a single-ended unit PA 105-1. FIG. 1B shows an example structure of two top metal layers for a differential unit PAs 105-2. Metal line 110-1 may be used to collect RF power from PA device 105-1 from low level metal layers, and metal lines 110-2, 110-3 may be used to collect RF power from PA device 105-2 from low level metal layers. Metal line 115-1 has a 45 degree offset from metal line 110-1 and may feed RF power to terminals of a transformer combiner to which it is coupled. Metal lines 115-2, 115-3 have 45 degree offsets from metal lines 110-2, 110-3 and may feed RF power to terminals of a transformer combiner to which they are coupled. Most semiconductor foundries allow 45 degree metal routing on top metals. Since 45 degree offset between metal traces allows x and y direction flipping without introducing mismatches, it enables a single gate orientation for compact transformer layout with substantially perfect symmetrical connections in different direction.

Figure 1C:
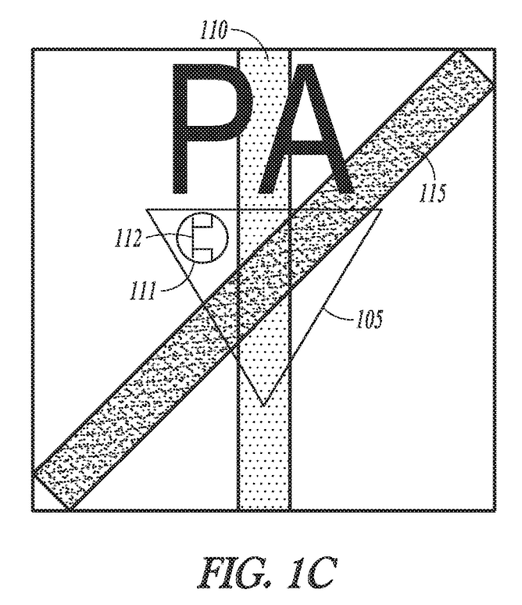
FIG. 1C illustrates a component of a unit cell whose orientation is common to unit cells when coupled with a symmetrical transformer combiner in accordance with some examples.

FIG. 1C illustrates an example of a component of a unit cell 105 whose orientation is common to unit cells when coupled with a symmetrical transformer combiner. For example, unit cell 105 may include a gate 112 of a transistor 111, where metal line 110 may be used to collect RF power from PA device 105 from low level metal layers, and metal line 115 has a 45 degree offset from metal line 110 and may feed RF power to terminals of a transformer combiner to which it is coupled.

Figure 2:
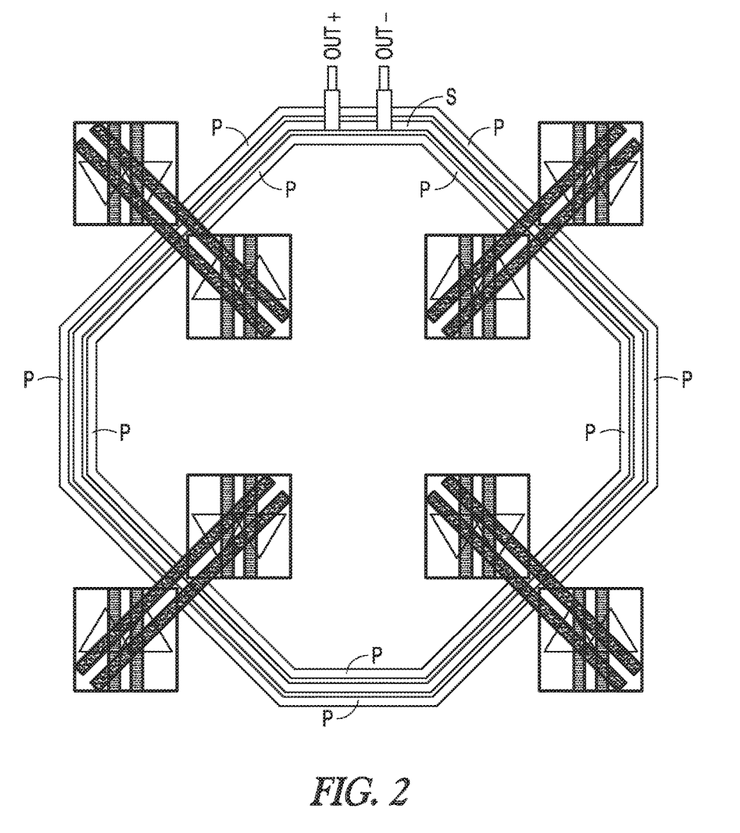
FIG. 2 shows an example of eight differential power amplifiers connected with an eight-way octagonal transformer combiner in accordance with some examples.
Figure 3:
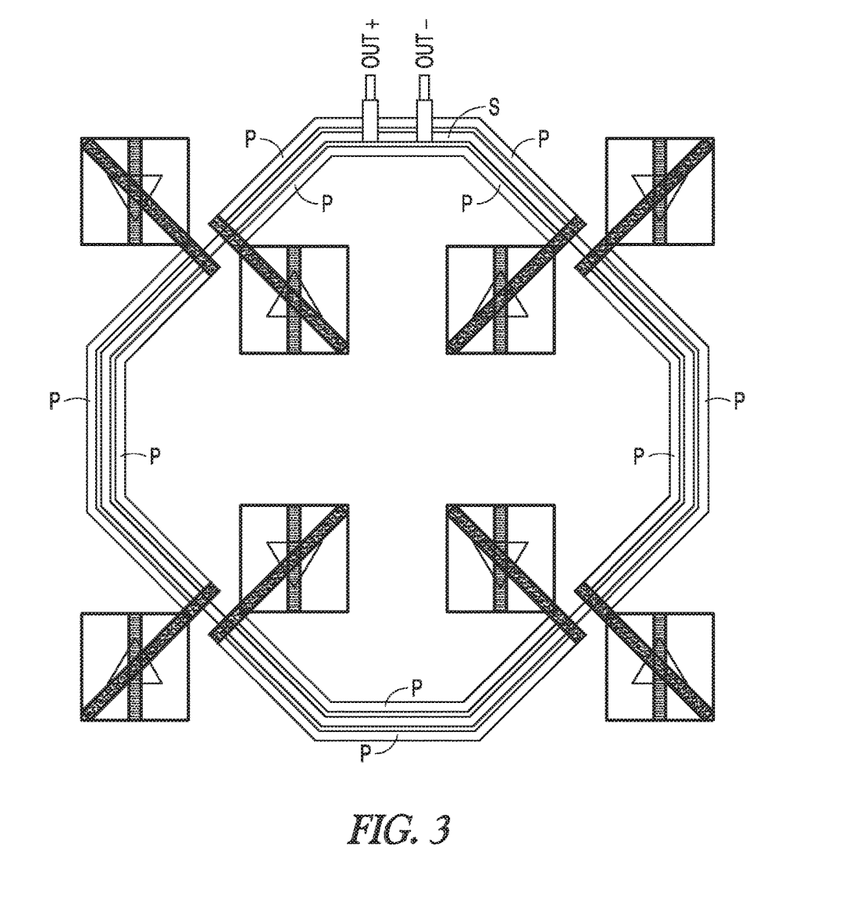
FIG. 3 shows an example of eight single-ended power amplifiers connected with an eight-way octagonal transformer combiner in accordance with some examples.
Figure 4:
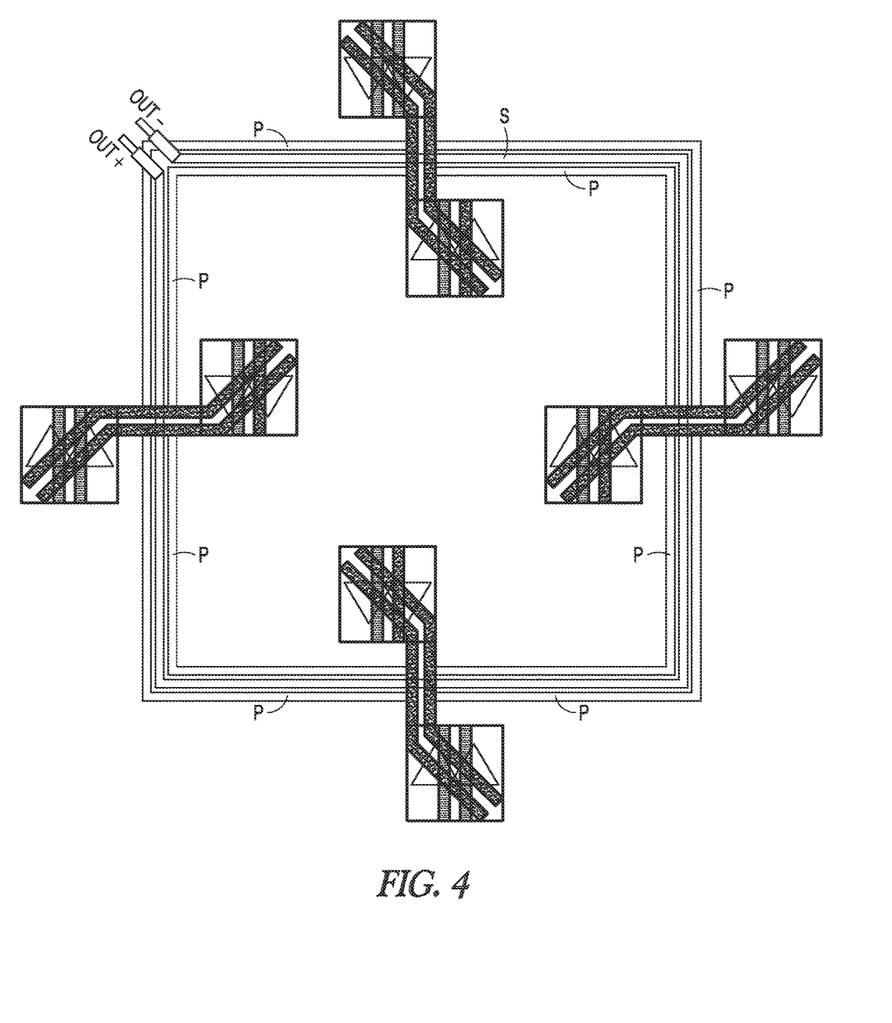
FIG. 4 shows an example of eight differential power amplifiers connected with an eight-way square transformer combiner in accordance with some examples.
Figure 5:
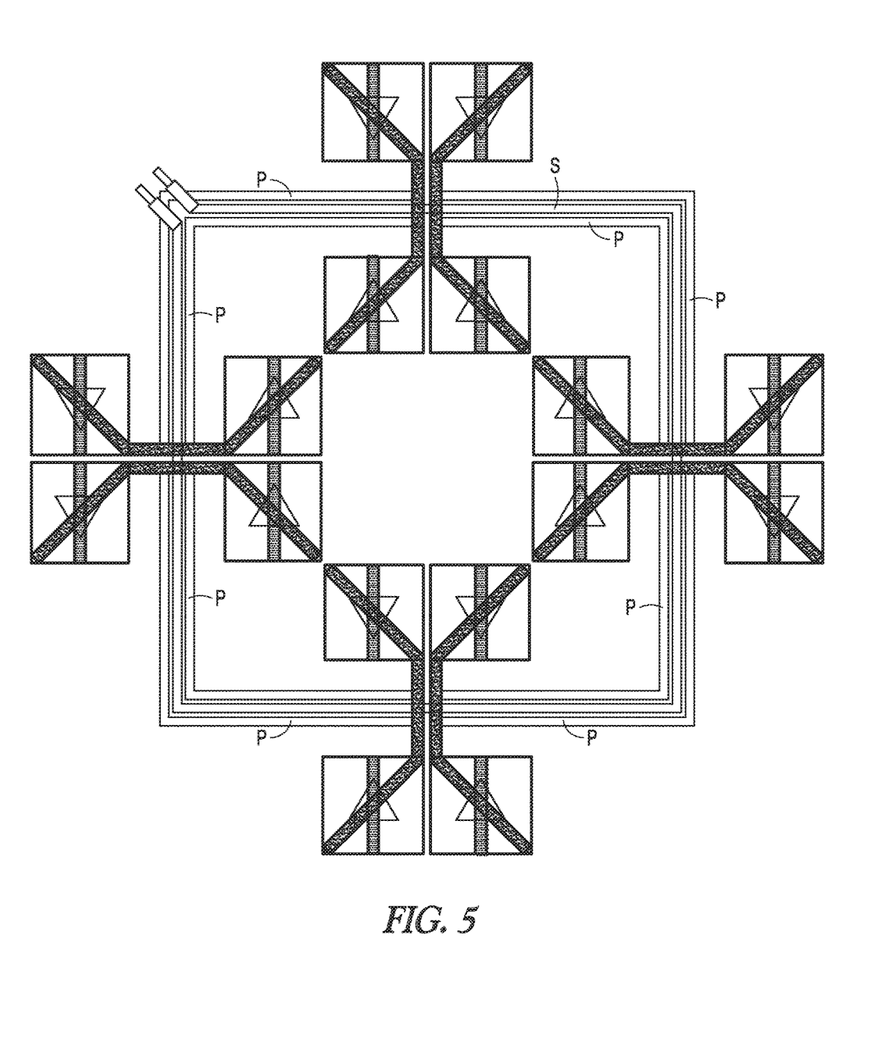
FIG. 5 shows an example of sixteen single-ended power amplifiers connected with an eight-way square transformer combiner in accordance with some examples.

FIGS. 2-5 show multiple examples of building eight-way transformer combiner with the unit PA cells of FIGS. 1A, 1B to achieve symmetrical layout design. FIG. 2 shows an example of eight differential power amplifiers connected with an eight-way octagonal transformer combiner. FIG. 3 shows an example of eight single-ended power amplifiers connected with an eight-way octagonal transformer combiner. FIG. 4 shows an example of eight differential power amplifiers connected with an eight-way square transformer combiner. FIG. 5 shows an example of sixteen single-ended power amplifiers connected with an eight-way square transformer combiner. A topology can be selected based on top level transceiver layout plan and target inductor values. As shown in FIGS. 2-5, unit PA cells can be placed both inside and outside of combiner loop having output terminals connected to a secondary loop S for a number of primary loops P. This may be helpful if transmission line type transformer is required for better performance. Similar topologies can also be used for both single ended and differential PA design. In some examples, a differential PA topology may be a critical component for CMOS high power PA design.

Figure 6:
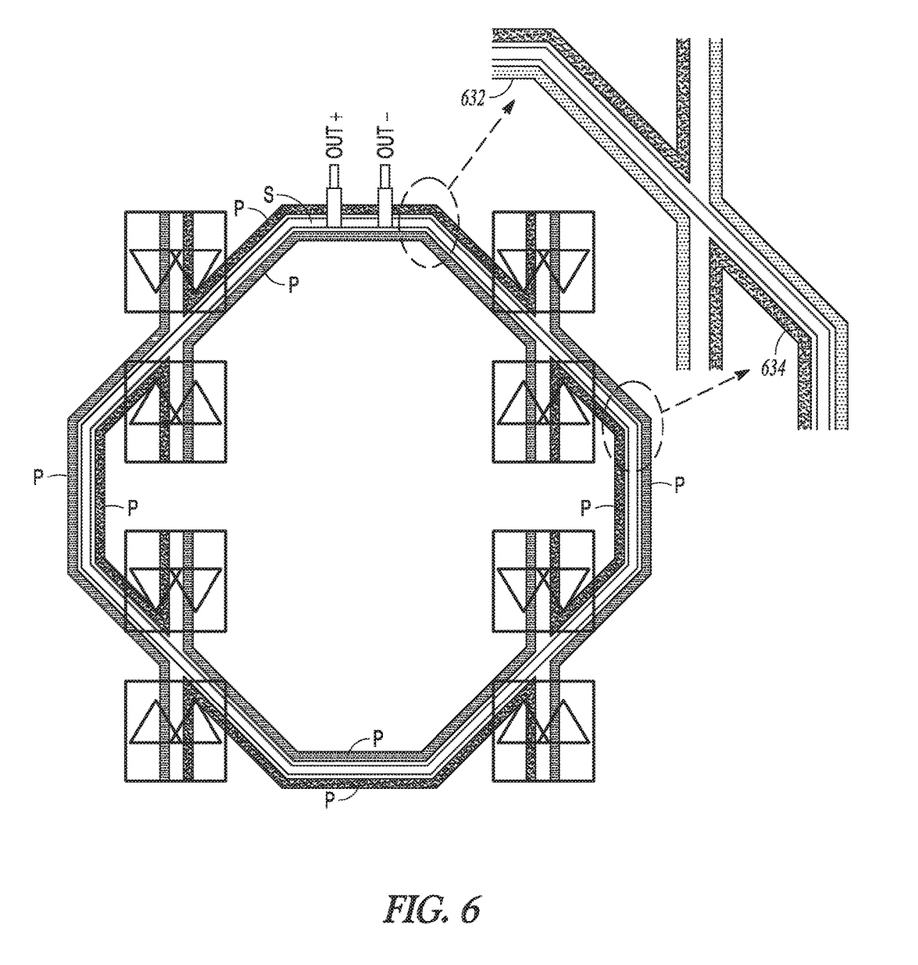
FIG. 6 shows an example of a slightly asymmetrical eight-way transformer combiner with eight differential power amplifiers in accordance with some examples.

FIG. 6 shows an example of a slightly asymmetrical eight-way transformer combiner with eight differential power amplifiers. FIG. 6 provides a simpler variance, which may use only one thick metal layer. A pair of differential PAs can be aligned vertically and placed at each corner of transformer, where the one metal layer of the differential PAs are parallel. Alternatively, a pair of differential PAs can be aligned with a horizontal arrangement and placed at each corner of the transformer configuration. This configuration allows top metal connection on top of each differential PA to connect directly to transformer primary inductors without additional bridging. However, as highlighted in FIG. 6, section 632 and section 634 are not perfectly identical. Even if the average effect of inner and outer PAs, if driving in phase, can reduce the mismatch of these two transformer sections, the impact of this asymmetry could still disrupt differential operation of each PA. Use of this topology can be considered if differential PA pair is not sensitive to this mismatch. Power and efficiency performance can benefit from simple metal connection between PA and transformer in this arrangement.

Figure 7:
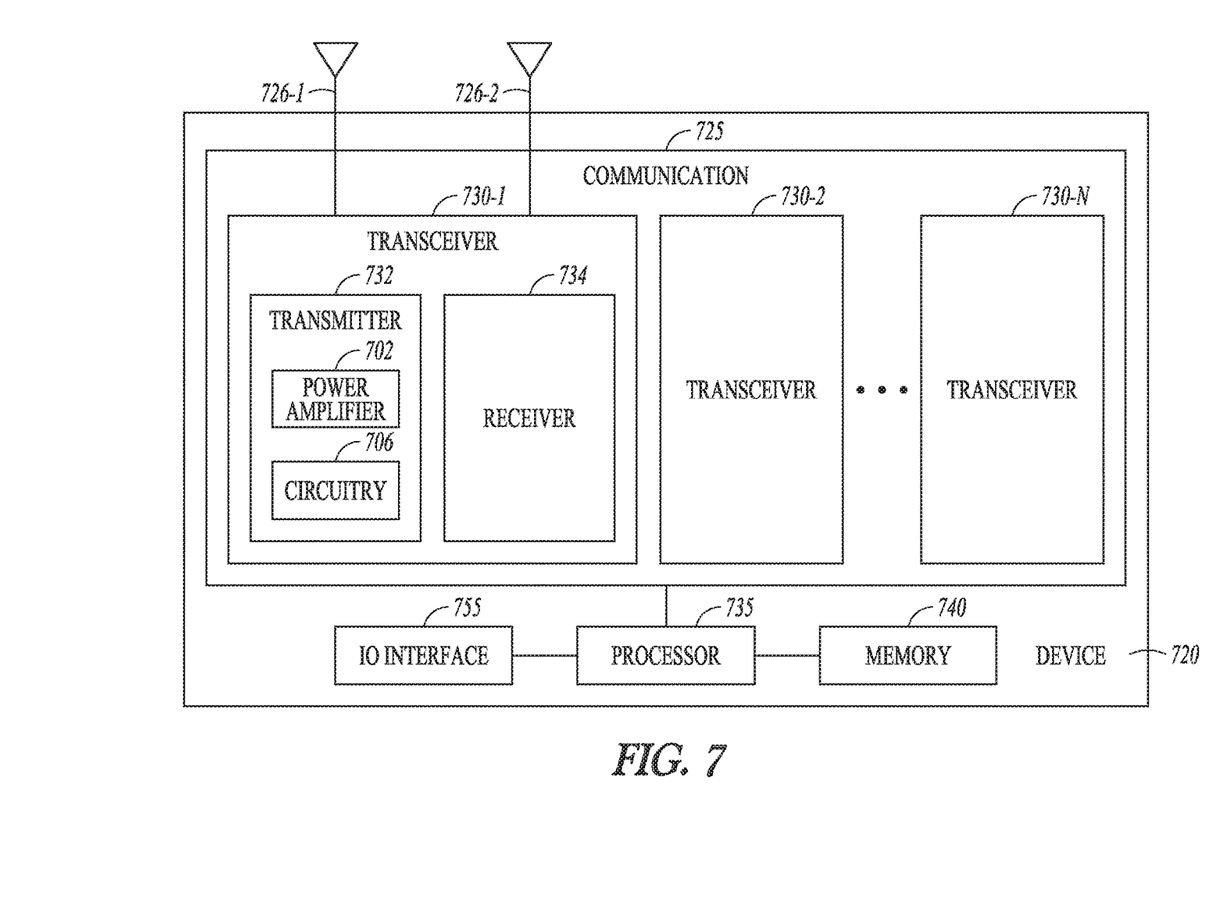
FIG. 7 shows an example device having a power amplifier in accordance with some examples in accordance with some examples.

FIG. 7 shows an example of a device 720 having a power amplifier 702 that may be configured as a compact and symmetric multi-way transformer combiner. Device 720 may include antennas 726-1, 726-2 and a communication interface 725 having one or more transceivers 730-1, 730-2 . . . 730-N. One or more transceivers 730-1, 730-2 . . . 730-N can include a transmitter 732 and a receiver 734. Communication interface 725 may be coupled to a processor 735. Processor 735 may be coupled to memory 740 to control a number of functions of device 725. Processor 735 may be realized as one or more processors. Processor 735 may also be coupled to an IO interface 755 to control the flow of signals in and out of device 720 relative to data flow with respect to device 720.

Power amplification can be provided to components with device 720. For example, power amplifier 702 of transmitter 732 can be configured according to any one of the unit PA cell, multi-way transformer combiner topologies discussed herein or similar topologies based on the desired operational characteristics for power amplifier 702. These operational characteristics can be based on the application of selected components of device 720. Power amplifier 702 may be used to provide RF power amplification for circuitry 706 of transmitter 732. Use of compact PA cells or other compact cells in a symmetric arrangement with a multi-way transformer combiner may be implemented for other components of device 720, which for convenience of presentation are not shown in FIG. 7. Use of compact cells in a symmetric arrangement with a multi-way transformer combiner is not limited to use in a wireless device such as device 720. Device 730 may be a mobile device.

The topologies described herein may provide a unique way to build unit device that can be used symmetrically to connect symmetrically to a multi-way transformer combiner and provide a compact unit device that can be disposed in the multi-way transformer combiner. The techniques taught herein having two metal lines with a 45 degree offset can be used to design high RF power PA using low voltage digital CMOS devices. The compact unit cell arranged symmetrically with a multi-way transformer combiner may provide multiple options for designing the structural layout of the multi-way transformer combiner. High RF power PAs implemented in advanced digital CMOS process has been one of the most challenging task among wireless radio integration. This technique may enable high power CMOS PA design and integrate LTE power level into a system on a chip (SoC). It may significantly lower the cost of a wireless system in a mobile platform, by eliminating use of high cost external PA module.

Figure 8:
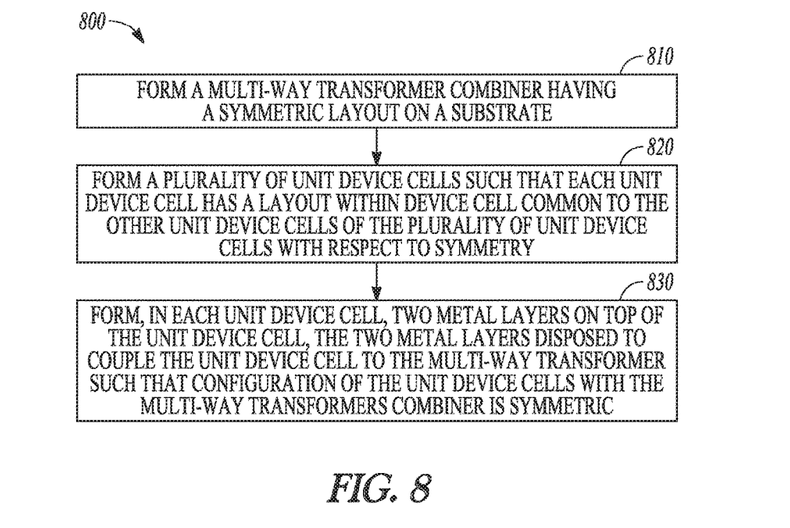
FIG. 8 shows features of an example method of forming an electronic device in accordance with some examples in accordance with some examples.

FIG. 8 shows features of an example method 800 of forming an electronic device. At 810, a multi-way transformer combiner is formed having a symmetric layout on a substrate. At 820, a plurality of unit device cells are formed such that each unit device cell has an active device and a layout within the unit device cell common to the other unit device cells of the plurality of unit device cells with respect to symmetry. Having a layout that is common to the other unit device cells can include an orientation that is flipped with respect to the x/y axis. Each unit device cell may have an active device disposed therein. At 830, in each unit device cell, two metal layers are formed on top of the unit device cell, the two metal layers disposed to couple the unit device cell to the multi-way transformer such that configuration of the unit device cells with the multi-way transformer combiner is symmetric.

In method 800 or similar methods, forming the plurality of unit device cells may include using complementary metal-oxide-semiconductor (CMOS) technology fabrication techniques. Using CMOS technology fabrication techniques may include using CMOS techniques that allow single gate orientation only. Alternatively, using CMOS technology fabrication techniques may include using CMOS techniques that allow more than single gate orientation.

In method 800 or similar methods, forming the two metal layers may include coupling a first metal layer of the two metal layers to the active device configured to operatively collect a signal from the respective unit device cell from the active device and forming a second metal layer of the two metal layers at a 45degree offset from the first metal layer and coupling the second metal layer to terminals of the multi-way transformer to feed the signal to the terminals. Forming the plurality of unit device cells may includes forming single-ended unit power amplifier device cells or forming differential unit power amplifier device cells.

In method 800 or similar methods, forming the two metal layers may include forming the two metal layers at an approximate 45 degree offset from each other by forming horizontal and vertical sections to provide the approximate 45 degree offset. Alternatively, forming the two metal layers may include forming each of the two metal layers as straight metal lines at an approximate 45 degree offset.

In method 800 or similar methods, forming the plurality of unit device cells may include forming a number of the unit device cells disposed inside a loop of the multi-way transformer combiner and forming a number of the unit device cells disposed outside the loop of the multi-way transformer combiner.

In method 800 or similar methods, features or other combinations of features, as taught herein, may be combined into a method of forming an electronic device according to the teachings herein.

In an example 1, an electronic device can comprise: a multi-way transformer combiner having a symmetric layout on a substrate; and a plurality of unit device cells, each unit device cell having a structural layout within the unit device cell common to the other unit device cells of the plurality of unit device cells with respect to symmetry, each unit device cell including: an active device; and two metal layers on top of the unit device cell, the unit device cell coupled to the multi-way transformer combiner by one of the two metal layers such that configuration of the unit device cells with the multi-way transformer combiner is symmetric.

In an example 2, the subject matter of example 1 can include the unit device cells including unit power amplifier cells, unit inductor/transformer based voltage-controlled oscillator (VCO) cells, or unit low noise amplifier cells.

In an example 3, the subject matter of any one of examples 1-2 can include within each unit device cell, a first metal layer of the two metal layers coupled to the active device to collect a signal from the active device and a second metal layer of the two metal layers, having an approximate 45 degree offset from the first metal layer, coupled to terminals of the multi-way transformer to feed the signal from the unit device cell to the terminals.

In an example 4, the subject matter of any one of examples 1-3 can include the second metal line configured as a straight metal line. In an example 5, the subject matter of any one of examples 1-3 can include the second metal line configured with the approximate 45 degree offset by horizontal and vertical sections.

In an example 6, the subject matter of any one of examples 1-5 can include the unit device cells being single-ended unit power amplifier device cells or differential unit power amplifier device cells.

In an example 7, the subject matter of any one of examples 1-6 can include a transistor having a gate, the gate having a gate orientation, and the first metal layer is coupled to the active device, the gate orientation of each unit device cell being the same.

In an example 8, the subject matter of any one of examples 1-7 can include the multi-way transformer combiner configured as an octagonal multi-way transformer combiner or as a square multi-way transformer combiner.

In an example 9, the subject matter of any one of examples 1-8 can include the multi-way transformer combiner configured as a two-way transformer combiner, a four-way transformer combiner, or an eight-way transformer combiner, and the unit device cells can be configured as unit radio frequency (RF) power amplifier device cells.

In an example 10, the subject matter of any one of examples 1-9 can include a number of the unit device cells disposed inside a loop of the multi-way transformer combiner and a number of the unit device cells disposed outside the loop of the multi-way transformer combiner.

In an example 11, an electronic device can comprise: a multi-way transformer combiner on a substrate; and a plurality of differential unit device cells, each differential unit device cell having a structural layout within the differential unit device cell common to the other differential unit device cells of the plurality of differential unit device cells with respect to symmetry, each differential unit device cell including: an active device; and two metal layers on top of the differential unit device cell, the two metal layers being parallel to each other, each of the two metal layers having a connection to the multi-way transformer such that configuration of the differential unit device cells with the multi-way transformer combiner is substantially symmetric except for asymmetry by the connections of the differential unit device cells to the multi-way transformer.

In an example 12, the subject matter of example 11 can include each differential unit device cell including a differential radio frequency (RF) power amplifier device with one of the two metal layers connected to one primary loop of the multi-way transformer combiner and the other metal layer of the two metal layers connected to output signals from the unit device.

In an example 13, the subject matter of any one of examples 11-12 can include the plurality of differential unit device cells including the differential unit device cells configured in pairs, the differential unit device cells of each pair coupled to the multi-way transformer combiner across from each other with one of the differential unit device cells of the pair inside a loop of the multi-way transformer combiner and the other differential unit device cell of the pair outside the loop of the multi-way transformer combiner.

In an example 14, the subject matter of any one of examples 11-13 can include the multi-way transformer combiner configured as an octagonal multi-way transformer combiner.

In an example 15, the subject matter of any one of examples 11-14 can include each active device of the plurality of differential unit device cells having a gate with an orientation that is the same as the gate of the other active device of the plurality of differential unit device.

In an example 16, a communication system can comprise: a processor; a memory coupled to the processor; and a communication interface coupled to the processor, the communication interface including a transceiver having a multi-way transformer combiner with a symmetric structural layout on a substrate, and a plurality of unit power amplifier cells coupled to the multi-way transformer combiner, each unit power amplifier cell having a structural layout within the unit power amplifier cell common to the other unit power amplifier cells of the plurality of unit power amplifier cells with respect to symmetry, each unit power amplifier cell including: an active device; and two metal layers on top of the unit power amplifier cell, the unit power amplifier cell coupled to the multi-way transformer combiner by one of the two metal layers such that configuration of the unit power amplifier cells with the multi-way transformer combiner is symmetric.

In an example 17, the subject matter of example 16 can include within each unit power amplifier cell, a first metal layer of the two metal layers coupled to the active device to collect a signal from the active device and a second metal layer of the two metal layers, having an approximate 45 degree offset from the first metal layer, coupled to terminals of the multi-way transformer to feed the signal from the unit power amplifier cell to the terminals In an example 18, the subject matter of any one of examples 16-17 can include the unit power amplifier cells configured as single-ended unit power amplifier cells or as differential unit power amplifier cells.

In an example 19, the subject matter of any one of examples 16-18 can include the active device including a transistor having a gate, the gate having a gate orientation, and the first metal layer coupled to the active device, the gate orientation of each unit power amplifier cell being the same.

In an example 20, the subject matter of any one of examples 16-19 can include the multi-way transformer combiner configured as an octagonal multi-way transformer combiner or as a square multi-way transformer combiner.

In an example 21, the subject matter of any one of examples 16-20 can include a number of the unit power amplifier cells disposed inside a loop of the multi-way transformer combiner and a number of the unit power amplifier cells disposed outside the loop of the multi-way transformer combiner.

In an example 22, a transceiver can comprise: a transmitter having a power amplifier to provide input to circuitry of the transmitter, the power amplifier having a multi-way transformer combiner with a symmetric structural layout on a substrate, and a plurality of unit power amplifier cells coupled to the multi-way transformer combiner, each unit power amplifier cell having a structural layout within the unit power amplifier cell common to the other unit power amplifier cells of the plurality of unit power amplifier cells with respect to symmetry, each unit power amplifier cell including: an active device; and two metal layers on top of the unit power amplifier cell, the unit power amplifier cell coupled to the multi-way transformer combiner by one of the two metal layers such that configuration of the unit power amplifier cells with the multi-way transformer combiner is symmetric.

In an example 23, the subject matter of example 22 can include within each unit power amplifier cell, a first metal layer of the two metal layers coupled to the active device to collect a signal from the active device and a second metal layer of the two metal layers, having an approximate 45 degree offset from the first metal layer, coupled to terminals of the multi-way transformer to feed the signal from the unit power amplifier cell to the terminals In an example 24, the subject matter of any one of examples 22-23 can include the unit power amplifier cells configured as single-ended unit power amplifier cells or as differential unit power amplifier cells.

In an example 25, the subject matter of any one of examples 22-24 can include the active device including a transistor having a gate, the gate having a gate orientation, and the first metal layer coupled to the active device, the gate orientation of each unit power amplifier cell being the same.

In an example 26, the subject matter of any one of examples 22-25 can include the multi-way transformer combiner configured as an octagonal multi-way transformer combiner or as a square multi-way transformer combiner.

In an example 27, the subject matter of any one of examples 22-26 can include a number of the unit power amplifier cells disposed inside a loop of the multi-way transformer combiner and a number of the unit power amplifier cells disposed outside the loop of the multi-way transformer combiner.

In an example 28, the subject matter of any one of examples 22-27 can include the transceiver configured with an antenna coupled to the transmitter.

In electronic devices, systems, or similar electronic devices and/or systems, features or other combinations of features, as taught herein, may be combined into electronic devices and/or systems according to the teachings herein.

In some embodiments, a mobile device implemented with components as taught herein may be part of a portable wireless communication device, such as a personal digital assistant (PDA), a laptop or portable computer with wireless communication capability, a web tablet, a wireless telephone, a smartphone, a wireless headset, a pager, an instant messaging device, a digital camera, an access point, a television, a medical device (e.g., a heart rate monitor, a blood pressure monitor, etc.), or other device that may receive and/or transmit information wirelessly. In some embodiments, the mobile device may include one or more of a keyboard, a display, a non-volatile memory port, multiple antennas, a graphics processor, an application processor, speakers, and other mobile device elements. The display may be an LCD screen including a touch screen.

The antennas may comprise one or more directional or omnidirectional antennas, including, for example, dipole antennas, monopole antennas, patch antennas, loop antennas, microstrip antennas or other types of antennas suitable for transmission of RF signals. In some multiple-input multiple-output (MIMO) embodiments, the antennas may be effectively separated to take advantage of spatial diversity and the different channel characteristics that may result.

Although some of the structures discussed herein are illustrated as having several separate functional elements, one or more of the functional elements may be combined and may be implemented by combinations of software-configured elements, such as processing elements including digital signal processors (DSPs), and/or other hardware elements. For example, some elements may comprise one or more microprocessors, DSPs, field-programmable gate arrays (FPGAs), application specific integrated circuits (ASICs), radio-frequency integrated circuits (RFICs) and combinations of various hardware and logic circuitry for performing at least the functions described herein. In some embodiments, the functional elements may refer to one or more processes operating on one or more processing elements.

Embodiments may be implemented in one or a combination of hardware, firmware, and software. Embodiments may also be implemented as instructions stored on a machine-readable storage device, which may be read and executed by at least one processor to perform the operations described herein. A machine-readable storage device may include any non-transitory mechanism for storing information in a form readable by a machine. For example, a machine-readable storage device may include read-only memory (ROM), random-access memory (RAM), magnetic disk storage media, optical storage media, flash-memory devices, and other storage devices and media. Some embodiments may include one or more processors and may be configured with instructions stored on a machine-readable storage device.

Although specific embodiments have been illustrated and described herein, it will be appreciated by those of ordinary skill in the art that any arrangement that is calculated to achieve the same purpose may be substituted for the specific embodiments shown. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description.

What is claimed is:

1. An electronic device comprising:
   a multi-way transformer combiner having a symmetric layout on a substrate; and
   a plurality of unit device cells, each unit device cell having a structural layout within the unit device cell common to the other unit device cells of the plurality of unit device cells with respect to symmetry, each unit device cell including:
   an active device; and
   two metal layers on top of the unit device cell, the unit device cell coupled to the multi-way transformer combiner by one of the two metal layers to form a symmetric configuration of the unit device cells with the multi-way transformer combiner, wherein a first metal layer of the two metal layers is coupled to the active device to collect a signal from the active device, and a second metal layer of the two metal layers having an approximate 45 degree offset from the first metal layer in the unit device cell is coupled to the multi-way transformer combiner to feed the signal from the unit device cell to the multi-way transformer combiner.

2. The electronic device of claim 1, wherein the plurality of unit device cells include a plurality of unit power amplifier cells, a plurality of unit inductor/transformer based voltage-controlled oscillator (VCO) cells, or a plurality of unit low noise amplifier cells.

3. The electronic device of claim 1, wherein the second metal layer is configured as a straight metal line.

4. The electronic device of claim 1, wherein the plurality of unit device cells are single-ended unit power amplifier device cells or differential unit power amplifier device cells.

5. The electronic device of claim 1, wherein the active device includes a transistor having a gate, the gate having a gate orientation, and the first metal layer is coupled to the active device, and wherein the gate orientation of each of the plurality of unit device cells being the same.

6. The electronic device of claim 1, wherein the multi-way transformer combiner is an octagonal multi-way transformer combiner or a square multi-way transformer combiner.

7. The electronic device of claim 1, wherein the multi-way transformer combiner is a two-way transformer combiner, a four-way transformer combiner, or an eight-way transformer combiner, and the unit device cells are unit radio frequency (RF) power amplifier device cells.

8. The electronic device of claim 7, wherein a number of the unit device cells are disposed inside a loop of the multi-way transformer combiner and a number of the unit device cells are disposed outside the loop of the multi-way transformer combiner.

9. An electronic device comprising:
   a multi-way transformer combiner on a substrate; and
   a plurality of differential unit device cells, each differential unit device cell having a structural layout within the differential unit device cell common to the other differential unit device cells of the plurality of differential unit device cells with respect to symmetry, each differential unit device cell including:
   two active devices; and two metal layers on top of the differential unit device cell with one metal layer of the two metal layers disposed over one of the two active devices and the other metal layer of the two metal layers disposed over the other of the two active devices, the two metal layers being parallel to each other, each of the two metal layers having a connection to the multi-way transformer combiner such that configuration of the differential unit device cells with the multi-way transformer combiner is substantially symmetric except for asymmetry by the connections of the differential unit device cells to the multi-way transformer combiner.

10. The electronic device of claim 9, wherein each differential unit device cell includes a differential radio frequency (RF) power amplifier device with one of the two metal layers connected to one primary loop of the multi-way transformer combiner.

11. The electronic device of claim 9, wherein the plurality of differential unit device cells includes the differential unit device cells configured in pairs, the differential unit device cells of each pair coupled to the multi-way transformer combiner across from each other with one of the differential unit device cells of the pair inside a loop of the multi-way transformer combiner and the other differential unit device cell of the pair outside the loop of the multi-way transformer combiner.

12. The electronic device of claim 9, wherein the multi-way transformer combiner is an octagonal multi-way transformer combiner.

13. The electronic device of claim 9, wherein each active device of the plurality of differential unit device cells has a gate with an orientation that is the same as the gate of the other active device of the plurality of differential unit device cells.

14. A transceiver comprising:
a transmitter having a power amplifier to provide input to circuitry of the transmitter, the power amplifier having a multi-way transformer combiner with a symmetric structural layout on a substrate, and a plurality of unit power amplifier cells coupled to the multi-way transformer combiner, each unit power amplifier cell having a structural layout within the unit power amplifier cell common to the other unit power amplifier cells of the plurality of unit power amplifier cells with respect to symmetry, each unit power amplifier cell including:
an active device; and
two metal layers on top of the unit power amplifier cell, the unit power amplifier cell coupled to the multi-way transformer combiner by one of the two metal layers such that configuration of the unit power amplifier cells with the multi-way transformer combiner is symmetric, wherein a first metal layer of the two metal layers is coupled to the active device to collect a signal from the active device and a second metal layer of the two metal layers has an approximate 45 degree offset from the first metal layer in the unit power amplifier cell and is coupled to the multi-way transformer combiner to feed the signal from the unit power amplifier cell to the multi-way transformer combiner.

15. The transceiver of claim 14, wherein the unit power amplifier cells are single-ended unit power amplifier cells or differential unit power amplifier cells.

16. The transceiver of claim 14, wherein the active device includes a transistor having a gate, the gate having a gate orientation, and the first metal layer is coupled to the active device, the gate orientation of each unit power amplifier cell being the same.

17. The transceiver of claim 14, wherein the multi-way transformer combiner is an octagonal multi-way transformer combiner or a square multi-way transformer combiner.

18. The transceiver of claim 14, wherein a number of the unit power amplifier cells are disposed inside a loop of the multi-way transformer combiner and a number of the unit power amplifier cells are disposed outside the loop of the multi-way transformer combiner.

19. The transceiver of claim 14, wherein the transceiver is configured with an antenna coupled to the transmitter.

20. A method of forming an electronic device comprising:
forming a multi-way transformer combiner having a symmetric layout on a substrate;
forming a plurality of unit device cells each having an active device and a layout within the plurality of unit device cells common to the other unit device cells of the plurality of unit device cells with respect to symmetry; and
forming, in each unit device cell, two metal layers on top of the unit device cell, the two metal layers disposed to couple the unit device cell to the multi-way transformer to form a symmetric configuration of the unit device cells with the multi-way transformer combiner, wherein forming the two metal layers includes coupling a first metal layer of the two metal layers to the active device configured to operatively collect a signal from the active device of the respective unit device cell and forming a second metal layer of the two metal layers at a 45degree offset from the first metal layer in the respective unit device cell and coupling the second metal layer to the multi-way transformer combiner to operatively feed the signal to the multi-way transformer combiner.

21. The method of claim 20, wherein forming the plurality of unit device cells includes using complementary metal-oxide-semiconductor (CMOS) technology fabrication techniques.

22. The method of claim 21, wherein using CMOS technology fabrication techniques includes using CMOS techniques that allow single gate orientation only.

23. The method of claim 20, wherein forming the plurality of unit device cells includes forming single-ended unit power amplifier device cells or forming differential unit power amplifier device cells.

24. The method of claim 20, wherein forming the plurality of unit device cells includes forming a number of the unit device cells disposed inside a loop of the multi-way transformer combiner and forming a number of the unit device cells disposed outside the loop of the multi-way transformer combiner.

* * * * *

UNITED STATES PATENT AND TRADEMARK OFFICE
CERTIFICATE OF CORRECTION

| | | |
|---|---|---|
| PATENT NO. | : 9,515,062 B2 | Page 1 of 1 |
| APPLICATION NO. | : 14/575908 | |
| DATED | : December 6, 2016 | |
| INVENTOR(S) | : Xu et al. | |

It is certified that error appears in the above-identified patent and that said Letters Patent is hereby corrected as shown below:

In the Claims

In Column 12, Line 39, in Claim 20, delete "45degree" and insert --45 degree--, therefor Signed and Sealed this
Thirteenth Day of February, 2018

Andrei Iancu
*Director of the United States Patent and Trademark Office*